United States Patent [19] … [11] Patent Number: 4,626,808
Nossek … [45] Date of Patent: Dec. 2, 1986

[54] ELECTRICAL FILTER CIRCUIT FOR PROCESSING ANALOG SAMPLING SIGNALS

[75] Inventor: Josef Nossek, Munich, Fed. Rep. of Germany

[73] Assignee: Siemens Aktiengesellschaft, Berlin and Munich, Fed. Rep. of Germany

[21] Appl. No.: 265,782

[22] Filed: May 21, 1981

[30] Foreign Application Priority Data

Jun. 13, 1980 [DE] Fed. Rep. of Germany ....... 3022252

[51] Int. Cl.$^4$ ...................... H03H 11/00; G11C 27/02
[52] U.S. Cl. .................................... 333/173; 307/521; 328/151; 330/109
[58] Field of Search ........................ 333/167, 173, 165; 328/151, 167; 307/520–521; 330/107, 109

[56] References Cited

U.S. PATENT DOCUMENTS 3,758,884  9/1973  Bahler et al. ................... 328/167 X
4,281,297  7/1981  Betzl et al. ......................... 333/165

OTHER PUBLICATIONS

IEEE Transaction on Circuits and Systems, vol. CAS-25, No. 12, Dec. 1978, pp. 1039–1044.
Electronics Letters, Feb. 1, 1979, vol. 15, No. 3, pp. 87–88.

Primary Examiner—Marvin L. Nussbaum
Attorney, Agent, or Firm—Hill, Van Santen, Steadman & Simson

[57] ABSTRACT

An electrical filter circuit for processing analog sampling signals consists of N+1 capacitors interconnected to cyclically circulate N signal charges, the capacitors all being of approximately the same size, and interconnected with an operational amplifier. A plurality of switches are employed, controlled by a clock signal having N+1 phases. Phase controlled switches supply an input signal to the input of the operational amplifier, and provide an output from the filter circuit.

7 Claims, 2 Drawing Figures

ELECTRICAL FILTER CIRCUIT FOR PROCESSING ANALOG SAMPLING SIGNALS

BACKGROUND OF THE INVENTION

1. Field of the Invention

The present invention relates to an electrical filter circuit for processing analog sampling signals and more particularly to a filter circuit consisting of a plurality of capacitors with switching means for interconnecting the capacitors with an operational amplifier and a reference potential at predetermined clock times.

2. The Prior Art

Switched capacitor filters, employing plural capacitors and operational amplifiers have been described in "Switched-Capacitor Filter Design Using the Bilinear z-Transform", in "IEEE Transactions on Circuits and Systems" Volume CAS-25, No. 12, December 1978, pp. 1039–1044, and in "Switched-Capacitor Circuits Bilinearly Equivalent to Floating Inductor or F.D.N.R." in "Electronics Letters", Feb. 1, 1979, Volume 15, No. 3, pp. 87–88. Such filters do not process analog signals on a continuous basis, but instead process discrete time samples generated at the frequency F, with a sampling period of $T = 1/F$. A variety of suitable sampling circuits are known in the art. Circuit means is necessary for connecting a sampling circuit between an analog signal source and a filter circuit, and also for reconverting the signals available at the output filter into continuous analog signals. The significant feature of switched capacitor filters is their simulation of inductances entirely by means of active circuit elements and capacitors, so that they are suitable for integration in monolithic form. Switched capacitor filters employ operational amplifiers and it is desirable to attain the smallest possible total number of circuit elements, while maintaining stability of the circuits.

In known circuits for switched capacitor filters, the inverting input is connected by way of a capacitor to the output of an operational amplifier, to provide in effect a counter coupling. However, the operational amplifiers typically employed require a high common mode rejection, since the non-inverting input of the operational amplifier cannot always be held at ground potential. In addition, when the capacitors are formed using MOS (metal oxide silicon) technology, the capacitance to ground unavoidably accompanying floating MOS capacitors can lead to significant disruptions of the filter function.

Circuit designs for switches used in connection with switched capacitor filters are known in the art. They are typically designed in such a way so they can be formed by an integration process together with the remaining filter structures. MOS transistors are particularly suitable for such switches. Such switches have control electrodes which, by application of a control voltage, render the switches conductive. When the control voltage is absent, the switch represents an open circuit, or an electrical interruption.

SUMMARY OF THE INVENTION

The principal object of the present invention is to provide circuit structures for switched-capacitor arrangements which are capable of resonant behavior, and therefore may be employed in electrical communications filter circuits.

In one embodiment of the present invention, this object is achieved by a plurality of switches which are disposed and controlled in such a manner that a self-contained conductor loop formed of N+1 capacitors supports the cyclical circulation of N signal charges. The coupling input for the signal charges occurs across at least one capacitor to which controlled switches are allocated, and which are connected to the inverting input of the operational amplifier. At least one controlled switch is connected to the output of the operational amplifier.

Other advantages and features of the invention will be manifest upon an inspection of the following description and the accompanying drawings.

BRIEF DESCRIPTION OF THE DRAWINGS

Reference will now be made to the accompanying drawings, in which.

DESCRIPTION OF THE PREFERRED EMBODIMENT

Figure 1:
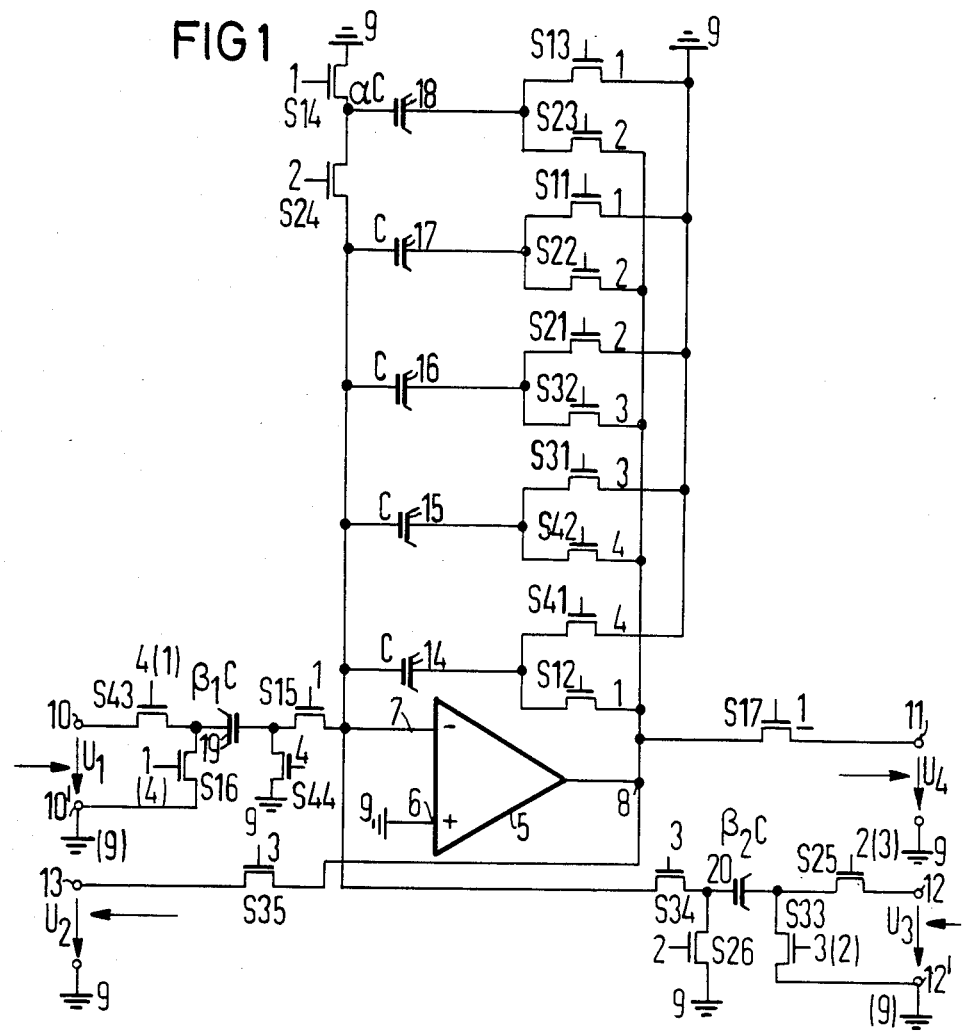
FIG. 1 is a schematic diagram of a filter circuit incorporating an illustrative embodiment of the present invention.

Referring now to FIG. 1, a plurality of switches S are shown in schematic form, each switch being designated with a two digit number, such as S13, S23, etc. The first digit of the two digit number indicates one of four consecutive clock phases during which the switch is closed, and the second digit serves to differentiate all of the switches closed during the same clock time. For example, six switches S11–S16 are closed during phase 1 of the clock pulse cycle having the period T.

An operational amplifier 5 has its noninverting input 6 connected to a reference potential 9 and the inverting input 7 is connected to reference potential 9 through switches S14 and S24, which are closed during clock phases 1 and 2 respectively. Four capacitors 14–17 each have one terminal connected in common with the inverting input 7 of the operational amplifier 5, each of the capacitors having the capacitance value C. The second electrode of each of the capacitors 14–17 is connected to reference potential 9 via the switches S11, S21, S31 and S41, which are closed during clock phases 1, 2, 3 and 4, respectively. The second electrode of capacitors 14–17 are also connected via switches S12, S22, S32 and S42 to the output 8 of the operational amplifier 5. These switches close during clock phases 1, 2, 3 and 4, respectively.

Figure 2:
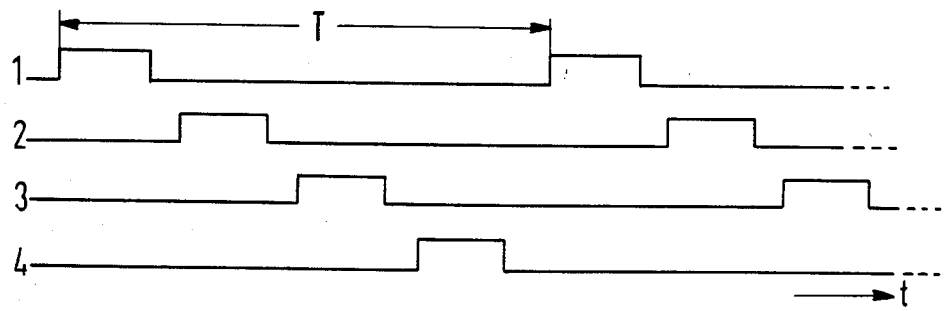
FIG. 2 is a diagram of a four phase clock signal relative to time t, used with the apparatus of FIG. 1.

FIG. 2 illustrates the time relationship of phases 1–4 of each clock period T. It can thus be seen that of the capacitors 14–17, only one is connected to the output 8 of the operational amplifier 5 at any given time, whereas a different one of the capacitors is connected to reference potential 9. The control of the switches occurs in such a manner that each of the capacitors 14–17 is connected to reference potential 9 during one clock phase, and is thereafter connected to the output 8 of the operational amplifier in the immediately following clock phase.

The four capacitors 14–17 form a self-contained conductor loop, such that three signal charges cyclically circulate. Expressed in general terms, n signal charges can cyclically circulate when N+1 capacitors are employed, to form a self-contained conductor loop.

A further capacitor 18 is provided for the purpose of attenuation of the self-oscillation. The capacitance of the capacitor 18 is $\alpha C$ and is in a position to tap the charge from the self-contained conductor loop. The rate at which this is done is set by determining the value $\alpha$. It is only necessary to connect the capacitor 18 to the output 8 of the operational amplifier during one of the N+1 clock phases, such as during clock phase 2, so that, in the embodiment illustrated in FIG. 1, the capacitor 17 is connected in parallel to the capacitor 18 via the switches S22-S24. The capacitor 18 can then be discharged during any other desired clock phase, and in the embodiment of FIG. 1 it is discharged during phase 1 via the switches S13 and S14 which apply the reference potential 9 to both ends of the capacitor 18 during clock phase 1. This results in a complete discharge of the capacitor 18 during clock phase 1.

A capacitor 19 is provided for the purpose of coupling the analog input voltage from the input terminals 10 and 10' to the inverting input 7 of the operational amplifier 5. Terminal 10' may be at the reference potential. The input terminal 10 is connected to one terminal of the capacitor 19 by switch S43 which may be closed either during clock phase 4 or during clock phase 1 without changing the function of the circuit. This is indicated by the reference numeral 4 adjacent the input to the switch 43, followed by the numeral (1). The same notation is used to designate inputs to other switches which may be operated during different clock phases. The same terminal of the capacitor 19 is connected by switch S16 to the reference potential of the input signal at the terminal 10'. The switch S16 may be closed during clock phase 1 or clock phase 4. The size of the capacitor 19 is $\beta_1 C$.

A switch S15 interconnects the other terminal of the capacitor 19 to the inverted input 7, and switch S44 connects the same terminal to reference potential 9.

A switch S17 is connected between the output 8 of the operational amplifier 5 and an output terminal 11. This switch is operative during clock phase 1. Another switch S35 interconnects the output 8 to an output terminal 13 at clock phase 3.

A further pair of input terminals 12 and 12' is provided, the latter may be at reference potential 9. Terminal 12 is connected through a capacitor 20 to the inverting input 7 of the operational amplifier 5, the capacitor 20 having the capacitance $\beta_2 C$. A switch S25 interconnects one terminal of the capacitor 20 to the terminals 12. This switch is operative during clock phases 2 or 3. Another switch S33, operable at clock phases 3 or 2, interconnects the same terminal of the capacitor to the input terminal 12'. The opposite terminal of the capacitor 20 is connected to the inverting input 7 through switch S34, and to reference potential 9 through switch S26.

In the operation of the apparatus of FIG. 1, charge packets are shifted in order to realize a resonator with the resonate frequency $f_{res}=F/N$. For this purpose N+1 capacitors of identical size and a (N+1) phase clock are required. A separate cancel phase is not required, since the capacitors are completely discharged when they emit their stored charge, assuming an ideal operational amplifier, and are thereby prepared for the acceptance of a new charge packet. If the individual capacitors differ in size, the voltage stored across the capacitors at any given time differs, without change in the size of the charge packets.

In the embodiment of FIG. 1, a stable resonator is provided with $F_{res}=F/3$, for the illustrated four-phase clock. The capacitor $\alpha C$ serves for the attenuation of the resonator. At the same time, the coupling circuits for input signals and output signals expand the resonator into a quad gate with which outgoing and return waves can be simulated at the input and output of a line resonator.

The so-called z-transformation, referred to on the aforementioned publications, can be employed for illustrating the transfer functions in the illustrated embodiment.

The denominator polynomial of all the transfer functions is:

$$N(z) = 1 - z^{-3}\frac{1}{1+\alpha}$$

Thus the natural frequencies lie on the z-plane with a circle with a radius $1/\sqrt[3]{1+\alpha}$. The numerator polynomials are of the type:

$$N(z) = \pm 1, 2z^{-k} \quad k=0,1,2,3.$$

The operational amplifier is not counter-coupled in the time intervals between individual clock phases, so that there is a danger of saturation or a latch-up effect. This is prevented by making the gap sufficiently short in duration so as to prevent a transfer of the operational amplifier into its saturation state. No latch-up problem occurs when so-called dynamic amplifiers are employed, since then the operational amplifier is current-free at the end of the respective transfer operation.

The filter circuit described above lends itself to manufacture in monolithic integratable form. It achieves the advantage that only one operational amplifier is required for an individual resonator, and the capacitors in the closed conductor loop are all of the same size. In addition, the resonator of the circuit described above is stable, and makes available a decoupled output signal.

It will be evident that various modifications and additions may be made in the apparatus described without departing from the essential features of novelty thereof, which are intended to be defined and secured by the appending claims.

What is claimed is:

1. An electrical filter circuit for functioning as a switched capacitor circuit for processing analog sampling signals, comprising a plurality of switches adapted to be controlled at prescribed clock phases, a plurality of capacitors connected to said switches, an operational amplifier having its non-inverting input connected to a reference potential, means connecting the inverting input and the output of said operational amplifier with said plurality of capacitors through individual ones of said switches to form a closed loop having N+1 capacitors, each of said N+1 capacitors being controlled by one of said switches to emit its charge during a first clock phase and controlled by another one of said switches to accept the charge in the immediately following clock phase, such that N signal charges repetitively circulate through said loop, said filter including input means including at least one capacitor connected to said inverting input of said operational amplifier, and output means including at least one output switch connected between said output of said operational amplifier and an output terminal of said filter.

2. The electrical filter circuit according to claim 1, including a further capacitor, said further capacitor being connected by switches controlled during discrete clock phases to said conductor loop for taking charge therefrom during one clock phase.

3. The electrical filter circuit according to claim 2, wherein said capacitor taking charge during one of the N+1 clock phases is connected in parallel by switch means to the capacitor which is connected to the output of the operational amplifier during such clock phase, and including discharge circuit means for discharging said charge-taking capacitor during a different clock phase.

4. The electrical filter circuit according to claim 3, wherein said discharge circuit means includes switch means for connecting both electrodes of said charge-taking capacitor to a reference potential.

5. The electrical filter circuit according to claim 1, including means for connecting one electrode of each of said N+1 capacitors to the inverting input of said operational amplifier and switch means for selectively connecting the other electrodes of said capacitors selectively to a reference potential, and to the output of said operational amplifier, during discrete clock phases, said switch means being controlled by N+1 clock phases whereby at any instant only one of the N+1 capacitors is connected to a reference potential and only one is connected to the output of the operational amplifier; and said switch means being controlled within a sampling period (T) so that each of the N+1 capacitors is connected to said reference potential during one of the N+1 clock phases and to the output of said operational amplifier during the immediately following clock phase.

6. The electrical filter circuit according to claim 1, wherein one terminal of said included in said input means capacitor is connected to a source of an input signal by a controlled switch and to a reference potential by a controlled switch, and wherein the other terminal of said input capacitor is connected to the inverting input of said operational amplifier by a controlled switch and to a reference potential by a controlled switch.

7. In an active filter section of the type utilizing an operational amplifier, the improvement comprising:
   switched capacitor feedback means, including a plurality of capacitors each having a first end connected to the input of said amplifier and having a second end selectively switchable between the output of said amplifier and electrical ground;
   switched capacitor input means, having two ends each selectively switchable to connect said input means either between said amplifier input and an input signal or to connect said input means across said ground; and
   switching means, for selectively switching said ends of capacitor means between their respective positions, to sample said input signal and thereby charge said capacitor input means, and to recirculate said charge through said feedback means to filter said signal.

* * * * *